United States Patent
Wang et al.

(10) Patent No.: US 9,246,094 B2
(45) Date of Patent: Jan. 26, 2016

(54) STACKED BI-LAYER AS THE LOW POWER SWITCHABLE RRAM

(71) Applicant: Intermolecular Inc., San Jose, CA (US)

(72) Inventors: Yun Wang, San Jose, CA (US);
Federico Nardi, Palo Alto, CA (US);
Milind Weling, Pleasanton, CA (US)

(73) Assignee: Intermolecular, Inc., San Jose, CA (US)

( * ) Notice: Subject to any disclaimer, the term of this patent is extended or adjusted under 35 U.S.C. 154(b) by 60 days.

(21) Appl. No.: 14/140,683

(22) Filed: Dec. 26, 2013

(65) Prior Publication Data
US 2015/0188045 A1    Jul. 2, 2015

(51) Int. Cl.
*H01L 47/00* (2006.01)
*H01L 45/00* (2006.01)
*H01L 27/24* (2006.01)

(52) U.S. Cl.
CPC ............ *H01L 45/1266* (2013.01); *H01L 45/08* (2013.01); *H01L 45/12* (2013.01); *H01L 45/1233* (2013.01); *H01L 45/1246* (2013.01); *H01L 45/1253* (2013.01); *H01L 45/145* (2013.01); *H01L 45/146* (2013.01); *H01L 45/16* (2013.01); *H01L 45/1625* (2013.01); *H01L 45/1633* (2013.01); *H01L 27/2409* (2013.01); *H01L 27/2463* (2013.01); *H01L 27/2481* (2013.01)

(58) Field of Classification Search
CPC . H01L 45/04; H01L 45/1246; H01L 45/1253; H01L 45/145
USPC ............................. 257/2, 4, E45.002, E45.003
See application file for complete search history.

(56) References Cited

U.S. PATENT DOCUMENTS

| | | | |
|---|---|---|---|
| 7,420,198 B2 | 9/2008 | Baek et al. | |
| 7,535,035 B2 | 5/2009 | Baek | |
| 7,883,929 B2 | 2/2011 | Choi | |
| 2006/0054950 A1 | 3/2006 | Baek | |
| 2006/0263289 A1 | 11/2006 | Heo et al. | |
| 2006/0289953 A1* | 12/2006 | Sakuma et al. | 257/412 |
| 2007/0257257 A1 | 11/2007 | Cho et al. | |
| 2008/0035907 A1* | 2/2008 | Czubatyj et al. | 257/4 |
| 2009/0227067 A1 | 9/2009 | Kumar et al. | |
| 2010/0243983 A1 | 9/2010 | Chiang et al. | |

(Continued)

OTHER PUBLICATIONS

Smyth; The defect chemistry or metal oxides; Jan. 1, 2000; Z—Book-Author; Chapters 15 8 9 and 12 pp. 174 118161 and 217237.

(Continued)

*Primary Examiner* — Robert Huber

(57) ABSTRACT

Provided are resistive random access memory (ReRAM) cells and methods of fabricating thereof. The resistive switching nonvolatile memory cells may include a first layer disposed. The first layer may be operable as a bottom electrode. The resistive switching nonvolatile memory cells may also include a second layer disposed over the first layer. The second layer may be operable as a resistive switching layer that is configured to switch between a first resistive state and a second resistive state. The resistive switching nonvolatile memory cells may include a third layer disposed over the second layer. The third layer may be operable as a resistive layer that is configured to determine, at least in part, an electrical resistivity of the resistive switching nonvolatile memory element. The third layer may include a semi-metallic material. The resistive switching nonvolatile memory cells may include a fourth layer that may be operable as a top electrode.

19 Claims, 5 Drawing Sheets

(56) References Cited

U.S. PATENT DOCUMENTS

| | | | |
|---|---|---|---|
| 2010/0258778 A1 | 10/2010 | Sung | |
| 2010/0314602 A1* | 12/2010 | Takano et al. ............... | 257/4 |
| 2011/0175050 A1 | 7/2011 | Chien et al. | |
| 2011/0193050 A1 | 8/2011 | Takano | |
| 2011/0227024 A1 | 9/2011 | Sekar | |
| 2011/0233507 A1 | 9/2011 | Sonehara | |
| 2012/0012807 A1 | 1/2012 | Yamaguchi | |
| 2012/0176831 A1 | 7/2012 | Xiao | |
| 2012/0217461 A1 | 8/2012 | Kobayashi | |
| 2013/0034947 A1 | 2/2013 | Hong | |
| 2013/0056700 A1 | 3/2013 | Wang | |
| 2013/0056702 A1 | 3/2013 | Wang | |
| 2013/0200323 A1 | 8/2013 | Pham | |
| 2014/0001429 A1* | 1/2014 | He et al. ................... | 257/2 |

OTHER PUBLICATIONS

Yang et al.; Memristive switching mechanism for metaloxidemetal nanodevices; Jun. 15, 2008; Macmillan Publishers Limited; Nature Nanotechnology pp. 429433 vol. 3 Jul. 2008.

Jae-Wan Park; Jong-Wan Park; Dal-Young Kim and Jeon-Kook Lee; Reproducible resistive switching in nonstoichiometric nickel oxide films grown by rf reactive sputtering for resistive random access memory applications; Jul. 22, 2005; Academia—Korea Institute of Science and Technology.

Seo, S., et al.; Conductivity Switching Characteristics and Reset Currents in NiO Films; Jan. 1, 2005; American Institute of Physics; Applied Physics Letters pp. 0935091 0935093 vol. 86.

Kuo et. al.; Characterization of nonstoichiometric TiO2 and ZrO2 thin films stabilized by Al2O3 and SiO2 additions; Jan. 1, 2003; Academia—National Dong Hwa University, Taiwan; J. Vac. Sci. Technol. A 21?6? Nov. Dec. 2003.

Kinoshita, K., et al.; Lowering the Switching Current of Resistance Random Access Memory Using a Hetero Junction Structure Consisting of Transition Metal Oxides; Jan. 1, 2006; The Japan Society of Applied Physics; Japanese Journal of Applied Physics vol. 45 No. 37 pp. L991L994.

Seo, S., et al.; Resistance Switching Mechanism of MetalOxideMetal Structure NiO; ; Samsung Electronics Co., Ltd.; Presentation of Samsung undated.

Kim, W., et al.; FormingFree NitrogenDoped AlOx RRAM with sub25nA Reset Current; Jan. 1, 2011; Academia—Stanford University; 2 pages.

Netzer, F.; Interfacial Oxide Layers at the MetalOxide Phase Boundary; Jan. 1, 2002; World Scientific Publishing Company; Surface Review and Letters vol. 9 Nos. 3 and 4 pp. 15531563.

Yang, J., et al.; The Mechanism of Electroforming of Metal Oxide Memristive Switches; May 5, 2009; Hewlett-Packard Company; Nanotechnology 10 pages.

Fillot, F., et al.; Investigations of the Interface Stability in HfO2Metal Electrodes; Jan. 1, 2003; STM-AMAT; Microelectronic Engineering pp. 384391.

Yu, S., et al.; On the Stochastic Nature of Resistive Switching in Metal Oxide RRAM Physical Modeling Monte Carlo Simulation and Experimental Characterization; Jan. 1, 2011; IEEE; IEEE 978145770505211.

Lee et al.; MultiLevel Switching of TripleLayered TaOx RRAM with Excellent Reliability for Storage Class Memory; Jan. 1, 2012; 2012 Symposium on VLSI Technology Digest of Technical Papers.

Lichtenwalner et al.; Lanthanum silicate gate dielectric stacks with subnanometer equivalent oxide thickness utilizing an interfacial silica consuption reaction; Jul. 26, 2005; American Institute of Physics.

\* cited by examiner

Initial Forming

Operational Switching

STACKED BI-LAYER AS THE LOW POWER SWITCHABLE RRAM

BACKGROUND

Nonvolatile memory is computer memory capable of retaining stored information even when unpowered. Nonvolatile memory is typically used for secondary storage or long-term persistent storage and may be used in addition to volatile memory, which loses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory, are being developed to meet these demands and requirements.

SUMMARY

Provided are resistive random access memory (ReRAM) cells and methods of fabricating thereof. Resistive switching nonvolatile memory elements may include a first layer formed on a substrate. The first layer may be operable as a bottom electrode. The resistive switching nonvolatile memory elements may further include a second layer formed over the first layer. The second layer may be operable as a resistive switching layer that is configured to switch between at least a first resistive state and a second resistive state. The resistive switching nonvolatile memory elements may also include a third layer formed over the second layer. The third layer may be operable as a resistive layer having a substantially constant resistance. The third layer may be configured to determine, at least in part, an electrical resistivity of the resistive switching nonvolatile memory element. The third layer may include a semi-metallic material. The semi-metallic material may be, at least in part, amorphous. Moreover, the resistive switching nonvolatile memory elements may include a fourth layer formed over the third layer. The fourth layer may be operable as a top electrode.

In some embodiments, the third layer may include one of hafnium oxide, zirconium oxide, tantalum oxide, titanium oxide, hafnium oxynitride, zirconium oxynitride, tantalum oxynitride, or titanium oxynitride. For example, the third layer may include hafnium oxide, and an atomic ratio of oxygen to hafnium may be configured based on a designated resistance of the nonvolatile memory element, based on a designated diffusion characteristic of the third layer, and further based on a designated amount of oxygen vacancies present in the third layer. In some embodiments, the third layer includes hafnium oxide having a ratio of oxygen to hafnium that is between about 1.0 and 1.8. More specifically, the third layer may include hafnium oxide having a ratio of oxygen to hafnium of about 1.5.

In some embodiments, the third layer may include a material that is a nitride and includes an amount of nitrogen sufficient to make the material charge neutral. Moreover, the third layer may be configured to provide a source of oxygen vacancies during operation of the resistive switching nonvolatile memory element. In some embodiments, the third layer may have a thickness of between about 5 nm and 10 nm. More specifically, the third layer may have a thickness between about 3 nm and 8 nm. The third layer may be configured to remain at least partially amorphous when subjected to anneal at a temperature of 750 degrees Celsius.

In some embodiments, the second layer directly interfaces the third layer. The second layer may include, at least in part, amorphous silicon oxide. Moreover, the first layer may include a layer of titanium nitride, and the fourth layer may include a layer of tantalum nitride.

Also disclosed herein are methods for forming a resistive switching nonvolatile memory element. The methods may include forming a first layer on a substrate. The first layer may be operable as a bottom electrode. The methods may also include forming a second layer over the first layer. The second layer may be operable as a resistive switching layer configured to switch between at least a first resistive state and a second resistive state. The methods may further include forming a third layer over the second layer. The third layer may be operable as a resistive layer having a substantially constant resistance. The third layer may determine, at least in part, an electrical resistivity of the nonvolatile memory element. The third layer may include a semi-metallic material. The methods may also include forming a fourth layer over the third layer. The fourth layer may be operable as a top electrode.

In some embodiments, forming the third layer includes using a physical vapor deposition process with oxygen gas to deposit a layer of material that includes, at least in part, hafnium oxide. Moreover, forming the third layer may include using a physical vapor deposition process to deposit a layer of material that includes, at least in part, hafnium, and oxidizing the hafnium in a plasma containing environment. In some embodiments, forming the third layer may include depositing a layer of stoichiometric hafnium oxide using an atomic layer deposition process, depositing a layer of hafnium on top of the layer of stoichiometric hafnium oxide using a physical vapor deposition process, and annealing the nonvolatile memory element. The annealing may cause the migration of hafnium from the layer of hafnium into the layer of stoichiometric hafnium oxide, thus forming the third layer having an atomic ratio of oxygen to hafnium of about 1.5.

Further disclosed herein are resistive switching nonvolatile memory elements that may include a substrate and a first layer formed on the substrate. The first layer may be operable as a bottom electrode. The resistive switching nonvolatile memory elements may also include a second layer formed over the first layer. The second layer may be operable as a resistive switching layer that is configured to switch between at least a first resistive state and a second resistive state. The resistive switching nonvolatile memory elements may further include a third layer formed over the second layer. The third layer may have a substantially constant resistance. Furthermore, the third layer may include a composition of hafnium oxide having a ratio of oxygen to hafnium that is configured based on a designated resistance of the nonvolatile memory element, based on a designated diffusion characteristic of the third layer, and further based on a designated amount of oxygen vacancies present in the third layer. The resistive switching nonvolatile memory elements may also include a fourth layer formed over the third layer. The fourth layer may be operable as a top electrode. In some embodiments, the third layer may have a thickness between about 5 nm and 10 nm.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings.

DETAILED DESCRIPTION

Figure 1A:
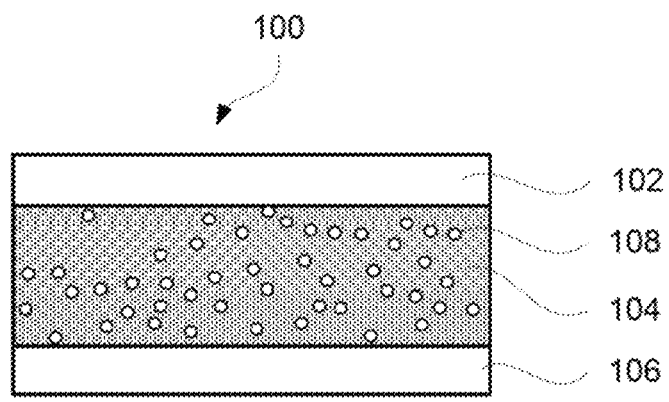
FIG. 1A illustrates a schematic representation of a ReRAM cell prior to initial forming operation, in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

INTRODUCTION

A ReRAM cell exhibiting resistive switching characteristics generally includes multiple layers formed into a stack, such as a "metal-insulator-metal" (MIM) stack. The stack includes two conductive layers operating as electrodes, which are identified as "M" and may include a metal, but may also include other types of conductive materials, such as doped silicon. The stack also includes an insulator layer provided between the two electrodes and identified as "I". The insulator layer changes its resistive properties when certain switching voltages are applied to the layer or, more generally, to the ReRAM cell including this layer. Due to its variable resistance characteristics, the insulator layer may be also referred to as a variable resistance layer. These changes in resistive properties are used to store data. For example, when two different resistive states are identified (e.g., a high resistive state and a low resistive state) for a ReRAM cell, one state may be associated with a logic "zero", while the other state may be associated with a logic "one" value. Similar approaches may be used when three or more resistive states may be identified for the same ReRAM cell leading to various multibit architectures.

The switching voltages may be applied as series of pulses and may be generally referred to as switching voltage profiles or, more specifically, set voltage profiles and reset voltage profiles. For example, a switching voltage pulse may be used to change ("set" or "reset") the resistive state followed by a smaller reading voltage pulse to determine the current state of the ReRAM cell at that time. Unlike the switching voltage pulse, the reading pulse is specifically configured to avoid changing the resistive state of the ReRAM cell and is configured only to determine the current state. The switching pulse may be repeated if the desired resistive state is not reached. The switching pulses may alternate with the reading pulses for feedback control. The switching pulses may vary from one to another based on their potential (e.g., a gradual increase in the potential), duration, and other characteristics. The reading pulses may be the same. The process of applying the switching pulses and reading pulses may continue until the desired resistive state is reached.

The change in resistance of the resistive switching layer is a dynamic process that needs to be well controlled to prevent over-programming. For example, when the resistive switching layer is switched from its high resistive state (HRS) to its low resistive state (LRS), a rapid drop in resistance associated with this switch may cause an excessive current through the resistive switching layer and an over-programming. The over-programming occurs when change in the resistance continues even after the resistive switching layer reaches its desirable resistance. One approach to prevent over-programming is by using very short pulses, e.g., about 50 nanoseconds, followed by a reading pulse. If the desired resistive state is not reached, another pulse is applied. The process of applying switching and reading pulses may be repeated until the desired resistance is not reached. However, shorter pulses have their own inherent limitations, such as requiring more pulses or higher voltages to achieve the same switching result, which may consume more power than fewer, longer, lower-voltage pulses. Furthermore, even during a relatively short switching pulse, the change in resistance may be sufficiently large to result in current spiking and over-programming. In some embodiments, the difference in resistances between the LRS and the HRS may be more than an order of magnitude to allow the read pulses to easily differentiate between the two states.

To prevent current spiking and over-programming, an embedded resistor is connected in series with the resistive switching layer and is used to limit the current through the resistive switching layer. The embedded resistor effectively functions as a voltage divider within the ReRAM cell. Unlike the resistive switching layer, the embedded resistor maintains a constant resistance throughout the entire operation of the cell. As a relative change of the overall ReRAM cell resistance (expressed as a ratio of the change in the resistance of the ReRAM cell to the overall initial resistance) when the resistive switching layer goes between the LRS and the HRS is less for ReRAM cells with embedded resistors than for similar cells without embedded resistor. This voltage divider/constant resistance characteristic of the embedded resistor helps to prevent the current spiking and over-programming.

Accordingly, an embedded resistor may be used to limit an amplitude of an electrical current that passes through a memory element during operation of a resistive random access memory (ReRAM) cell. Conventional embedded resistors often do not provide a full combination of good resistivity, good diffusion barrier characteristics, and a good reservoir of oxygen vacancies. For example, conventional materials used as embedded resistors may provide sufficient electrical resistivity. However, these materials might not provide a sufficient reservoir of oxygen vacancies for prolonged switching of the memory element and might also not provide a sufficient migration barrier to prevent migration of materials included in other layers, such as titanium which may be included in an electrode of the memory element. Moreover, other conventional embedded resistors may provide sufficient reservoirs of oxygen vacancies, but might have resistances that are too high to allow low voltage operation of the memory element.

Various embodiments disclosed herein provide resistive switching nonvolatile memory elements that may simultaneously provide a good source of oxygen vacancies during operation of the memory element, a good and stable resistivity/conductance that still allows low voltage operation of the memory element, and also good diffusion barrier characteristics which protect the switching layer of the memory element. For example, memory elements as disclosed herein may include embedded resistors that have a relatively large thickness for providing a good reservoir of oxygen vacancies during operation. The resistivity of the material used for such embedded resistors may be tuned to achieve a desirable overall resistance at that thickness. Moreover, because a greater thickness may be used, the embedded resistors may also function as effective diffusion barriers and protect resistive switching layers from reacting with diffused materials from other layers, such as a top electrode. An embedded resistor as disclosed herein may also be configured to be made of a material, such as a metal-rich or semi-metallic hafnium oxide, which has a sufficient conductance to allow low voltage operation despite a larger thickness of the embedded resistor. Accordingly, a thickness and material of the embedded resistor may be configured to provide the memory elements with a large switching endurance and good switching characteristics as well as good barrier characteristics and low voltage operation characteristics. These characteristics may be achieved by maintaining a stable resistance of the embedded resistor during operation, protecting the resistive switching layer from contaminants that may be released by other layers, and providing a stable source and sink of oxygen vacancies for the resistive switching layer.

Examples of Nonvolatile ReRAM Cells and their Switching Mechanisms

A brief description of ReRAM cells is provided for context and better understanding of various features associated with embedded resistors in the ReRAM cells. As stated above, a ReRAM cell includes a dielectric material formed into a layer exhibiting resistive switching characteristics. A dielectric, which is normally insulating, can be made to conduct through one or more conductive paths formed after application of a voltage. The conductive path formation can arise from different mechanisms, including defects, metal migration, and other mechanisms further described below. Once one or more conductive paths (e.g., filaments) are formed in the dielectric component of a memory device, these conductive paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

FIG. 1A illustrates a schematic representation of ReRAM cell 100 including first electrode 102, second electrode 106, and resistive switching layer 104 disposed in between first electrode 102 and second electrode 106. It should be noted that the "first" and "second" references for electrodes 102 and 106 are used solely for differentiation and not to imply any processing order or particular spatial orientation of these electrodes. ReRAM cell 100 may also include other components, such as an embedded resistor, diode, diffusion barrier layer, and other components. ReRAM cell 100 is sometimes referred to as a memory element or a memory unit.

First electrode 102 and second electrode 106 may be used as conductive lines within a memory array or other types of devices that ReRAM cell is integrated into. As such, electrode 102 and 106 are generally formed from conductive materials. As stated above, one of the electrodes may be reactive electrode and act as a source and as a reservoir of defects for the resistive switching layer. That is, defects may travel through an interface formed by this electrode with the resistive switching layer (i.e., the reactive interface).

Resistive switching layer 104 which may be initially formed from a dielectric material and later can be made to conduct through one or more conductive paths formed within the layer by applying first a forming voltage and then a switching voltage. To provide this resistive switching functionality, resistive switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

FIG. 1A is a schematic representation of ReRAM cell 100 prior to initial formation of conductive paths, in accordance with some embodiments. Resistive switching layer 104 may include some defects 108. Additional defects 108 may be provided within first electrode 102 and may be later transferred to resistive switching layer 104 during the formation operation. In some embodiments, the resistive switching layer 104 has substantially no defects prior to forming operation and all defects are provided from first electrode 102 during forming. Second electrode 106 may or may not have any defects. It should be noted that regardless of presence or absence of defects in second electrode 106, substantially no defects are exchanged between second electrode 106 and resistive switching layer 104 during forming and/or switching operations.

Figure 1B:
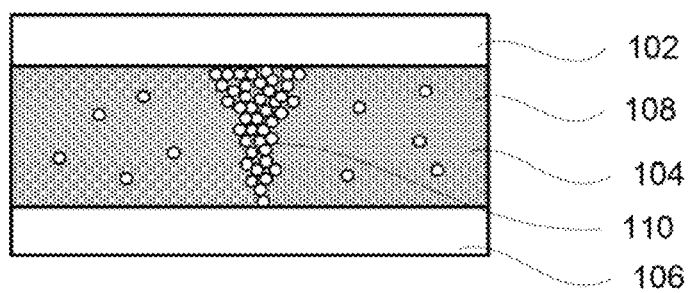
FIGS. 1B and 1C illustrate schematic representations of the ReRAM cell in its high resistive state (HRS) and low resistive state (LRS), in accordance with some embodiments.

During the forming operation, ReRAM cell 100 changes its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistive switching layer 104 to form these conductive paths as, for example, schematically shown in FIG. 1B. Furthermore, some or all defects 108 forming the conductive paths may enter resistive switching layer 104 from first electrode 102. For simplicity, all these phenomena are collectively referred to as reorientation of defects within ReRAM cell 100. This reorientation of defects 108 occurs when a certain forming voltage is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Figure 1C:
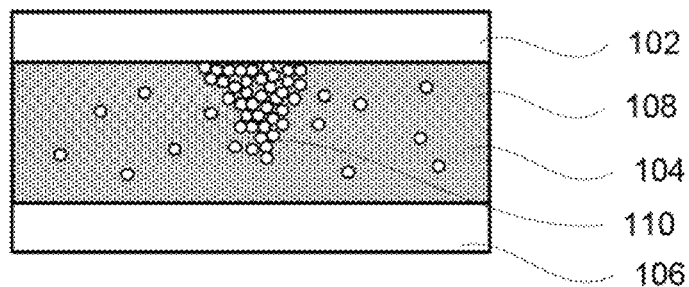

Resistive switching involves breaking and reforming conductive paths through resistive switching layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or formed back again. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into first electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and first electrode 102, the conductive paths may break closer to the interface with second electrode 106, somewhere within resistive switching layer 104, or at the interface with first electrode 102. This breakage generally does not correspond to complete dispersion of defects forming these conductive paths and may be a self-limiting process, i.e., the process may stop after some initial breakage occurs.

When switching from its HRS to LRS, which is often referred to as a set operation, resistive switching layer 104 may receive some defects from first electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 106 during the set operation has the same polarity as a voltage applied during the reset operation. This type of switching is referred to as unipolar switching. Alternatively, a voltage applied to electrodes 102 and 106 during the set operation may have different polarity as a voltage applied during the reset operation. This type of switching is referred to as bipolar switching. Setting and resetting operations may be repeated multiple times as will now be described with reference to FIGS. 2A and 2B.

Figure 2A:
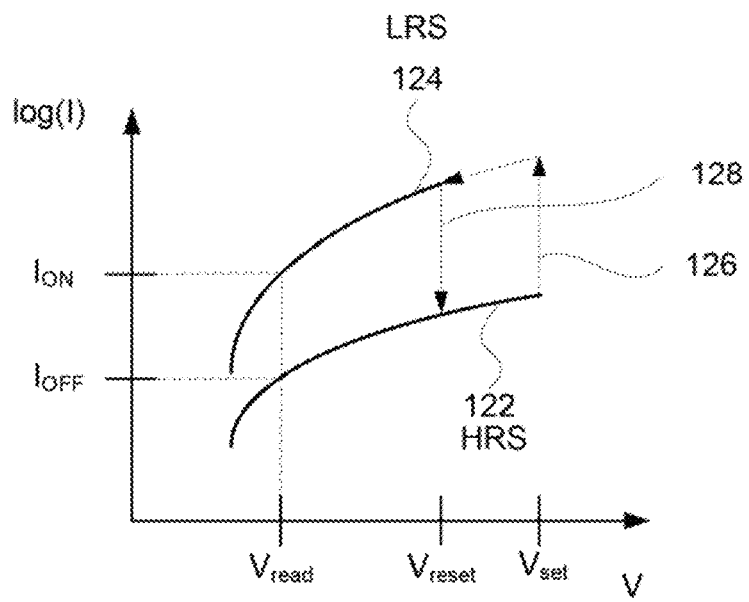
FIG. 2A illustrates a plot of a current passing through a unipolar ReRAM cell as a function of a voltage applied to the ReRAM cell, in accordance with some embodiments.
Figure 2B:
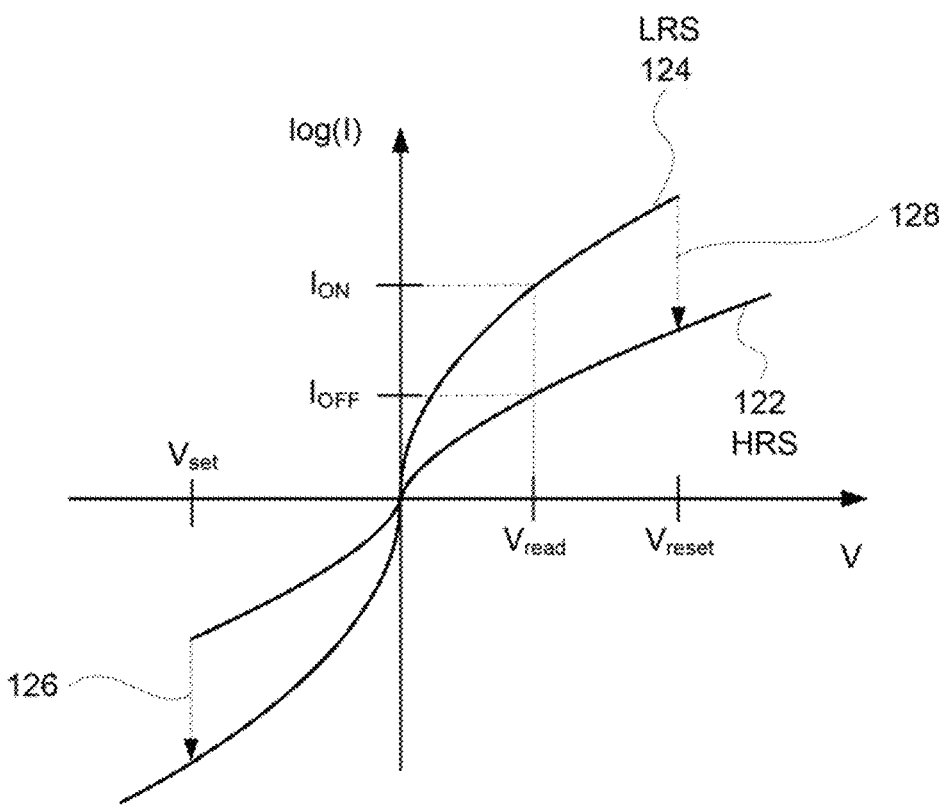
FIG. 2B illustrates a plot of a current passing through a bipolar ReRAM cell as a function of a voltage applied to the ReRAM cell, in accordance with some embodiments.

Specifically, FIG. 2A illustrates a plot of a current passing through a unipolar ReRAM cell as a function of a voltage applied to the ReRAM cell, in accordance with some embodiments. FIG. 2B illustrates the same type of a plot for a bipolar ReRAM cell, in accordance with some embodiments. The HRS is defined by line 122, while the LRS is defined by 124 in both plots. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of resistive switching layer can be sensed by applying a sensing voltage to its electrodes. The sensing voltage is sometimes referred to as a "READ" voltage or simply a reading voltage and indicated as $V_{READ}$ in FIG. 2. If the ReRAM cell is in its HRS (represented by line 122 in FIGS. 2A and 2B), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the resistive switching layer as described above with reference to FIGS. 1B and 1C. The switching from the HRS to LRS is indicated by dashed line 126 in FIGS. 2A and 2B. The resistance characteristics of the ReRAM cell in its LRS are represented by line 124. When the read voltage ($V_{READ}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage ($V_{RESET}$) is applied to the ReRAM cell to break the previously formed conductive paths in the resistive switching layer. Switching from a LRS to HRS is indicated by dashed line 128. Detecting the state of the ReRAM cell while it is in its HRS is described above.

Overall, the ReRAM cell may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$). ReRAM cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm$^2$ measured at 0.5 V per 20 Å of oxide thickness in HRS.

Examples of ReRAM Cells

Figure 3:
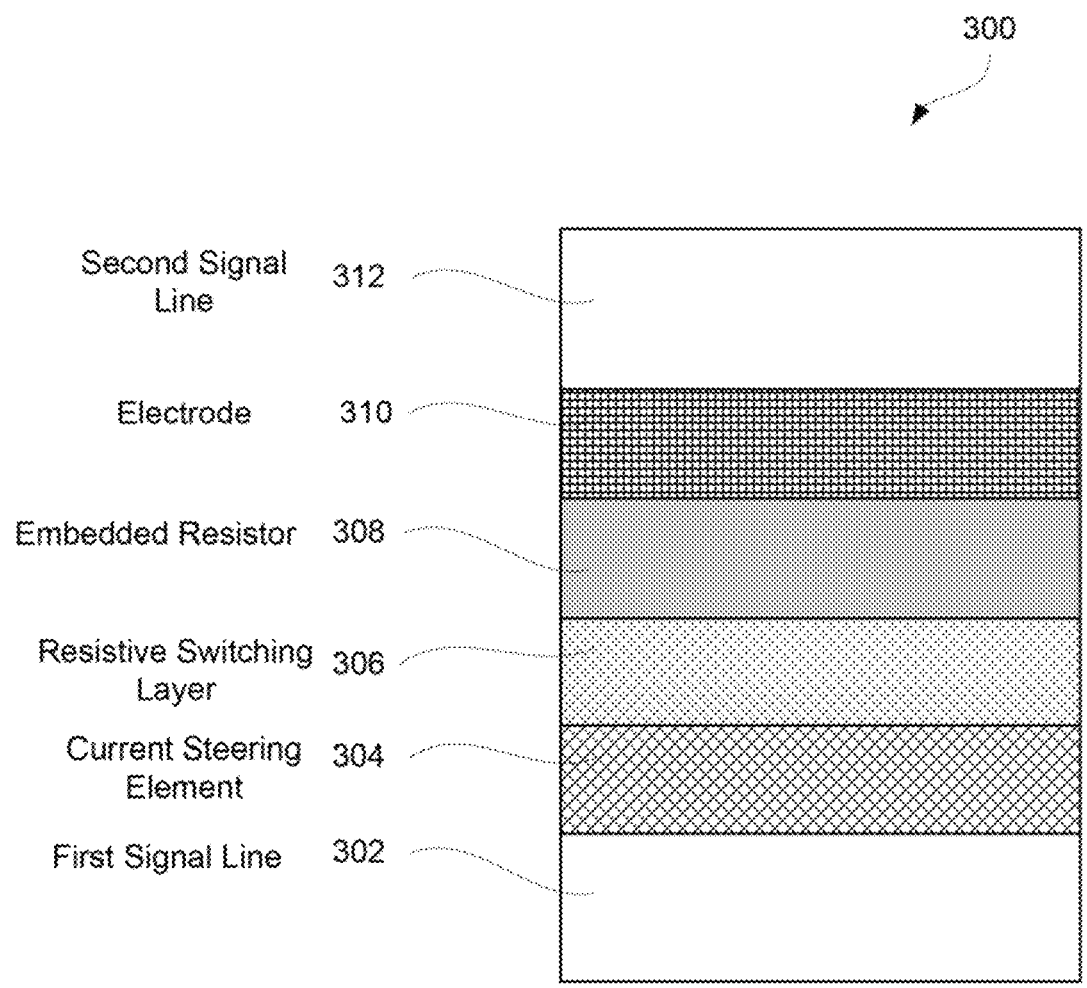
FIG. 3 illustrates a schematic representation of a ReRAM cell including an embedded resistor, resistive switching layer, and other components, in accordance with some embodiments.

FIG. 3 illustrates a schematic representation of a ReRAM cell 300, in accordance with some embodiments. ReRAM cell 300 may include a first signal line 302, a current steering element 304, a resistive switching layer 306, an embedded resistor 308, an intermediate electrode 310, and a second signal line 312. The "first" and "second" terminology is used herein only for differentiating reasons and does not imply any deposition order or spatial orientation of the layers unless specifically noted. In some embodiments, ReRAM cell 300 has more or fewer layers. For example, an intermediate layer may be disposed between electrode 310 and embedded resistor 308 in order to improve electrical connection between electrode 310 and embedded resistor 308. Furthermore, current steering element 304 and/or intermediate electrode 310 may be omitted from ReRAM cell 300. In some embodiments, embedded resistor 308 may directly interface resistive switching layer 306.

In the example illustrated in FIG. 3, a portion of current steering element 304 is also operable as another intermediate electrode interfacing resistive switching layer 306. Likewise, when intermediate electrode 310 is not present, a portion of embedded resistor 310 may be operable as an intermediate electrode. In some embodiments, resistive switching layer 306 is positioned in between and directly interfaces two designated electrodes. Regardless of these configurations one electrode (standalone or a part of another component) interfacing resistive switching layer 306 may be an inert electrode and may not exchange defects with resistive switching layer 306. Another electrode (standalone or a part of another component) that also interfaces resistive switching layer 306 may be active and may exchange defects with resistive switching layer 306. For example, a titanium nitride electrode may accept and release oxygen vacancies into resistive switching layer 306, while a doped polysilicon electrode may form a passivation silicon oxide layer that blocks defects from going in and out of resistive switching layer 306. In the example illustrated in FIG. 3, current steering element 304 may include a bottom p-doped polysilicon portion, which interfaces second signal line 302, a top n-doped polysilicon portion, which interfaces resistive switching layer 306 and is operable as an electrode, more specifically, an inert electrode.

In some embodiments, the electrodes may be sufficiently conductive and may be used as signal lines. Alternatively, signal lines and electrodes may be separate components as, for example, illustrated in FIG. 3. First signal line 302 and second signal line 312 provide electrical connections to ReRAM cell 300. For example, first signal line 302 and/or second signal line 312 extend between multiple ReRAM cells, which may be cells provided in the same row or the same column of a memory array as further described below with reference to FIGS. 5A and 5B. First signal line 302 and second signal line 312 may be made from conductive materials, such as n-doped polysilicon, p-doped polysilicon, titanium nitride, ruthenium, iridium, platinum, and tantalum nitride. The signal lines may have a thickness of less than about 100 nanometers (nm), such as less than about 50 nm and even less than about 10 nm. Thinner electrodes may be formed using atomic layer deposition (ALD) techniques.

Current steering element 304, if one is present, may be an intervening electrical component, such as a p-n junction diode, p-i-n diode, transistor, or other similar device disposed between first signal line 302 and second signal line 312. As such, current steering element 304 is connected in series with resistive switching layer 306. In some embodiments, current steering element 304 may include two or more layers of semiconductor materials, such as two or more doped silicon layers, that are configured to direct the flow of current through the device. Current steering element 304 may be a diode that includes a p-doped silicon layer, an un-doped intrinsic layer, and an n-doped silicon layer. These layers are not specifically identified in FIG. 3. The overall resistance of current steering element 304 may be between about 1 kilo-Ohm and about 100 Mega-Ohm. The overall resistance generally depends on the type of current steering element 304 and direction of the current flow through current steering element 304 (e.g., forward or reversed biased). In some embodiments, current steering element 304 may include one or more nitrides. For example, current steering element 304 may be a layer of titanium nitride.

Resistive switching layer 306 can be fabricated from a dielectric material, such as a metal oxide material or other similar material that can be switched between two or more stable resistive states. In some embodiments, resistive switching layer 306 is fabricated from a silicon oxide. Accordingly, resistive switching layer 306 may be a layer of SiO$_2$ that is formed on and directly interfaces current steering element 304. Moreover, resistive switching layer 306 may have a thickness of between about 1 nm to about 100 nm, such as between about 2 nm and 20 nm or, more specifically, between about 5 nm and 10 nm. For example, resistive switching layer 306 may have a thickness of about 10 nm. Thinner resistive switching layers may be deposited using ALD, while thicker resistive switching layers may be deposited using may be deposited using ALD or physical vapor deposition (PVD) or, in some embodiments, chemical vapor deposition (CVD).

Embedded resistor 308 may be fabricated from any of metal oxides, metal oxynitrides, metal silicon nitrides, metal silicon oxynitrides, metal aluminum nitrides, metal aluminum oxynitrides, metal boron nitrides, or metal boron oxynitrides. Specific examples of materials suitable for embedded resistor 308 include hafnium oxide, tantalum oxide, aluminum oxide, lanthanum oxide, yttrium oxide, dysprosium oxide, ytterbium oxide, zirconium oxide, titanium oxide, hafnium oxynitride, zirconium oxynitride, tantalum oxynitride, and titanium oxynitride. In some embodiments, one or more characteristics or properties of embedded resistor may be configured to provide suitable resistance and diffusion barrier properties while also providing a good reservoir of oxygen vacancies for ReRAM cell 300. As previously discussed, conventional embedded resistors are limited because they are not able to provide all of these properties simultaneously. Accordingly, one or more properties of one or more materials included in embedded resistor 308 may be configured to provide an embedded resistor that is sufficiently thick enough to provide good diffusion barrier and oxygen vacancy reservoir characteristics while also having sufficient conductance to allow low voltage operation of ReRAM cell 300.

More specifically, an oxygen to metal ratio of one or more materials included in embedded resistor 308 may be determined or configured based on a designated or desired resistance of embedded resistor 308. In some embodiments, embedded resistor 308 may be configured to have an electrical resistance that is substantially equal to a resistance of resistive switching layer 306 at a particular switching voltage and current for a particular device geometry. In this way, there may be a symmetric division of a voltage applied to ReRAM cell 300 between resistive switching layer 306 and embedded resistor 308. For example, if a switching voltage of 2 V and a switching current of 10 μA are applied to ReRAM cell 300, a total resistance of ReRAM cell may be about 200 KOhm, and embedded resistor 308 may have a resistance of about 100 KOhm. As discussed in greater detail below, the electrical resistance of embedded resistor 308 may be configured or tuned to achieve this target resistance by configuring or modifying the geometry of embedded resistor 308 (i.e. its thickness and diameter or width) and its composition (i.e. metal to oxygen ratio).

Thus, according to some embodiments, the resistivity of embedded resistor 308 may be determined, at least in part, based on a relative metal and oxygen content of a material included within embedded resistor 308. For example, if embedded resistor 308 is made of hafnium oxide, an atomic ratio of oxygen to hafnium within embedded resistor 308 may be configured to achieve a particular resistivity of the layer of hafnium oxide that makes up embedded resistor 308 and enables low voltage operation of ReRAM cell 300. More specifically, embedded resistor 308 may include hafnium oxide and may have a ratio of oxygen to hafnium that is between about 1.0 and 1.8. In one example, the ratio of oxygen to hafnium may be about 1.5. Applicants have determined that the use of a metal rich oxide, such as $HfO_{1.5}$, may enable the deposition of a thicker embedded resistor that still has a resistance suitable for low voltage operations. Accordingly, embedded resistor 308 may be thicker than conventional embedded resistors, but still achieve the same target resistance.

In some embodiments, embedded resistor 308 may be configured to have a thickness that is determined based on a designated diffusion characteristic and a designated amount of oxygen vacancies present embedded resistor 308. Accordingly, embedded resistor may be configured to be thick enough to substantially prevent any diffusion of materials from a layer, such as electrode 310, into another layer, such as resistive switching layer 306. For example, if electrode 310 includes tantalum nitride, embedded resistor 308 may be configured to have a thickness that prevents the migration of tantalum into resistive switching layer 306, which may include $SiO_x$. Thus, embedded resistor 308 may provide a buffer that increases the distance between electrode 310 and resistive switching layer 306 and prevents a metal, such as tantalum or titanium, from migrating from electrode 310 into resistive switching layer 306 and reacting with silicon oxide which may be included in resistive switching layer 306. Furthermore, an increased thickness of embedded resistor 308, as compared to conventional embedded resistors, confers better oxygen vacancy reservoir characteristics due to the increased amount of material included in embedded resistor 308. The better oxygen reservoir characteristics may enable embedded resistor 308 and ReRAM cell 300 to endure more switching cycles.

Accordingly, in some embodiments, embedded resistor 308 has a thickness of between about 5 nm and 10 nm. More specifically, embedded resistor 308 may have a thickness of between about 3 nm and 8 nm. In one example, a footprint (i.e., cross-sectional area) of embedded resistor 308 may be between about 20 nanometers-square and 100 nanometers-square or, more specifically, between about 30 nanometers-square and 60 nanometers-square, such as about 60 nanometers-square. It will be appreciated that a size or diameter of ReRAM cell 300 and embedded resistor 308 may be determined or configured to achieve a particular target resistance which may be, for example, 100 KOhms. Moreover, a thickness and composition of embedded resistor 308 may also be adjusted for a particular size or diameter to also achieve the target resistance. In this way, a size, thickness, and composition of embedded resistor 308 may each be configured to achieve a particular target resistance which may be determined based on a desired resistance at a particular switching voltage and current.

In some embodiments, the semi-metallic material included in embedded resistor 308 is, at least in part, amorphous. For example, the semi-metallic material included in embedded resistor 308 may be less than 5% crystalline by volume, as determined by X-ray diffraction. Moreover, embedded resistor may be configured to remain at least partially amorphous even if it is subsequently subjected to an anneal process which may include heating ReRAM cell 300 at a temperature of 750 degrees Celsius.

As similarly stated above, embedded resistor 308 may include a material that is a nitride, such as hafnium oxynitride. In some embodiments, when a nitride is included in embedded resistor 308, an amount of nitride included in embedded resistor 308 may be sufficient to achieve charge neutrality of embedded resistor 308. In this way, embedded resistor 308 may include a nitride, and may be configured to be charge neutral.

Electrode 310 may be fabricated from a conductive material that has a desirable conductivity and work function, such as p-type polysilicon, n-type polysilicon, transition metals, transition metal alloys, transition metal nitrides, or transition metal carbides. For example, electrode 310 may include one or more of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), or ruthenium (Ru). Electrode 310 may include titanium/aluminum alloy and/or a silicon-doped aluminum. In some embodiments, electrode 310 may be formed from titanium, tantalum, or aluminum. Electrode 310 may be between about 5 nm and about 500 nm thick or, more specifically, between about 10 nm and about 100 nm thick.

Processing Examples

Figure 4:
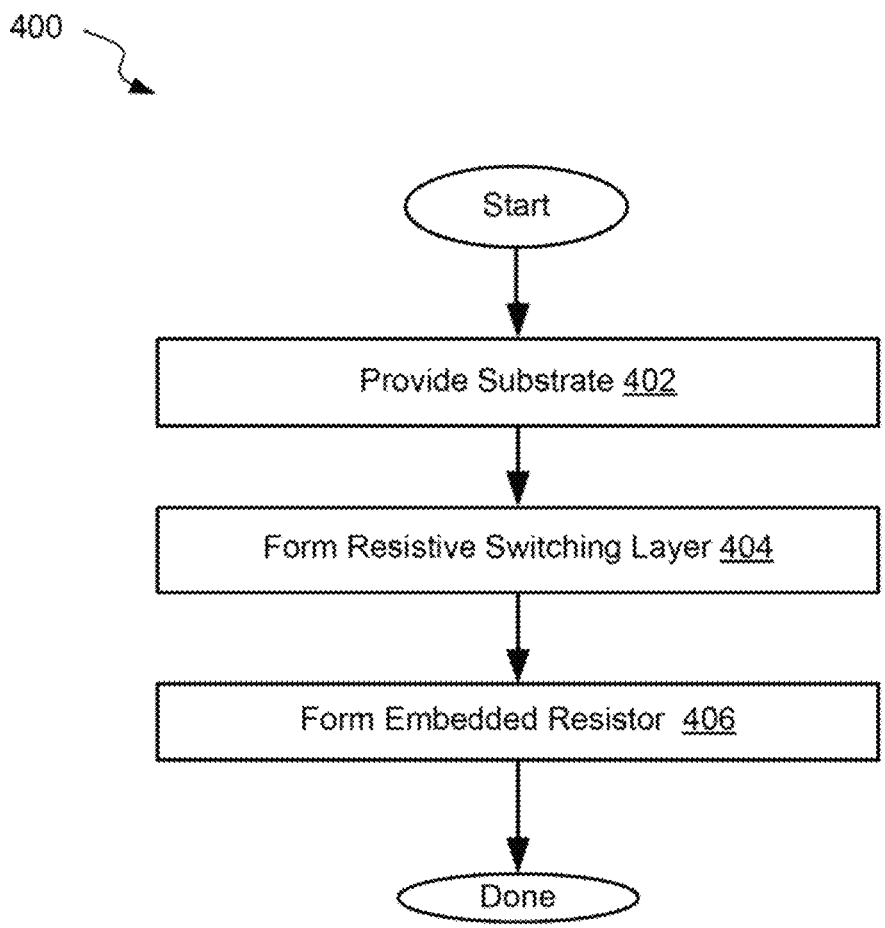
FIG. 4 illustrates a process flowchart corresponding to a method of fabricating a ReRAM cell, in accordance with some embodiments.

FIG. 4 illustrates a process flowchart corresponding to method 400 of fabricating a ReRAM cell, in accordance with some embodiments. Method 400 may commence with providing a substrate during operation 402. The substrate may include one or more components, such as a first signal line, a first electrode, and a current steering element. In other embodiments, method 400 involves forming the first signal line, the first electrode, and/or, for example, the current steering element on the substrate. The signal line can be made of silicon (e.g., doped polysilicon), a silicide, titanium nitride, or other appropriate materials listed elsewhere in this document. For example, a titanium nitride layer may be formed using PVD or other suitable deposition techniques. Deposition of the titanium nitride layer may be performed using a titanium target in a nitrogen atmosphere maintained at a pressure of between about 1-20 millitorr. A deposition rate of about 0.05-0.5 nm per second may be used. These process parameters are provided as examples and generally depend on deposited materials, tools, deposition rates, and other factors. Other processing techniques, such as ALD, PLD, CVD, evaporation, and the like can also be used to deposit the first signal line and, in some embodiments, the current steering element.

Method 400 may proceed with forming a resistive switching layer during operation 404. The resistive switching layer may be formed directly over the substrate or current steering element, if included. Thus, the resistive switching layer may directly interface the current steering element. In some embodiments, the embedded resistor may or may be separated by one or more other layer, e.g., an interface layer that prevents diffusion of materials between the embedded resistor and the resistive switching layer. As similarly discussed above, the resistive switching layer may include a material, such as silicon oxide, and may have a thickness of about 1 nm. Any suitable deposition technique may be used to form the resistive switching layer, such as an atomic layer deposition (ALD) process or a physical vapor deposition (PVD) process. Other processing techniques, such as PLD, CVD, evaporation, and the like may also be used to deposit the resistive switching layer.

Method 400 may proceed with forming an embedded resistor during operation 406. Various examples of embedded resistors are described above with reference to FIG. 3. In some embodiments, the embedded resistor is formed from one of hafnium oxide, tantalum oxide, aluminum oxide, lanthanum oxide, yttrium oxide, dysprosium oxide, ytterbium oxide, zirconium oxide, titanium oxide, hafnium oxynitride, zirconium oxynitride, tantalum oxynitride, and titanium oxynitride. As previously discussed, a ratio of each element in these materials may be specifically tailored to achieve desirable properties of the embedded resistor prior to its electrical breakdown and after its electrical breakdown. For example, an embedded resistor may include hafnium oxide and may have a ratio of oxygen to hafnium that is determined based on a size and diameter of the ReRAM cell and embedded resistor. Thus, the ratio of oxygen to hafnium may be determined based on the geometry of the embedded resistor and configured to achieve a particular target resistance. For example, the ratio of oxygen to hafnium may be between about 1.0 and 1.8. In one example, the ratio of oxygen to hafnium may be about 1.5. Moreover, the embedded resistor may have a thickness of between about 3-10 nm.

Operation 406 may involve PVD, ALD, or other techniques. For example, hafnium oxide may be deposited using a PVD target including hafnium. Sputtering may be performed in an oxygen-containing atmosphere. In this example, the composition of the embedded resistor depends on a concentration of oxygen in the sputtering environment as well as relative amounts of hafnium in the sputtering target. For example, a hafnium oxide layer having a thickness of between about 5-10 nm may be formed using reactive sputtering by employing a metal hafnium target in a 20-60% oxygen atmosphere. A power of 100-1000 Watts (W) may be used to achieve deposition rates of between about 0.01 and 0.1 nm per second. These process parameters are provided as examples and generally depend on deposited materials, tools, deposition rates, and other factors. In another example, a PVD process may be used to deposit a layer of hafnium and a plasma containing environment may be used to oxide the deposited layer.

ALD may be also used to deposit the embedded resistor. For example, an ALD process may be used to form a hafnium oxide layer using hafnium precursors, such as tetrakis(diethylamido) hafnium (TDEAHf), tetrakis(dimethylamido) hafnium (TDMAHf), tetrakis(ethylmethylamido) hafnium (TEMAHf) or hafnium chloride ($HfCl_4$), and a suitable oxidant, such as water, oxygen plasma, or ozone. Examples of other hafnium containing precursors include bis(tert-butylcyclopentadienyl)dimethyl hafnium ($C_{20}H_{32}Hf$), bis(methyl-η5-cyclopentadienyl) methoxymethyl hafnium ($HfCH_3(OCH_3)[C_5H_4(CH_3)]_2$), bis(trimethylsilyl)amido hafnium chloride ($[[(CH_3)_3Si]_2N]_2HfCl_2$), dimethylbis(cyclopentadienyl) hafnium (($C_5H_5)_2Hf(CH_3)_2$), hafnium isopropoxide isopropanol adduct ($C_{12}H_{28}HfO_4$), and hafnium tert-butoxide (HTB). Some hafnium containing precursors can be represented with a formula (RR'N) 4Hf, where R and R' are independent hydrogen or alkyl groups and may be the same or different.

In some embodiments, a combination of an ALD process and a PVD process may be used to form the embedded resistor. For example, an ALD process may be used to deposit a layer of stoichiometric hafnium oxide on another layer, such as a switching layer. A PVD process may be used to deposit a layer of hafnium on top of the layer of stoichiometric hafnium oxide. An annealing process may be used to heat the embedded resistor. In some embodiments, the annealing process may cause the migration of hafnium from the layer of hafnium into the layer of stoichiometric hafnium oxide. The annealing process may be controlled such that a desired atomic ratio of oxygen to hafnium may be achieved. As similarly discussed above, the ratio of oxygen to hafnium may be between about 1.0 and 1.8, or more specifically may be about 1.5.

Memory Array Examples

Figure 5A:
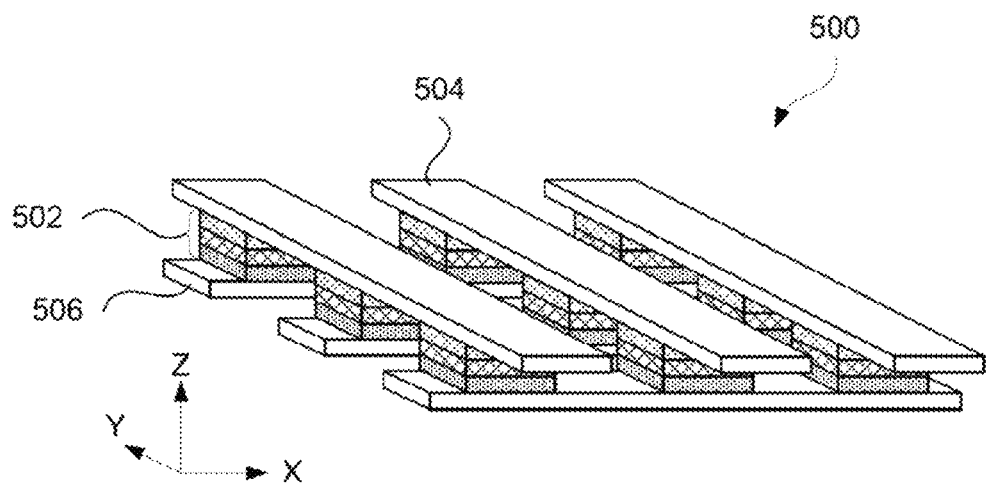
FIGS. 5A and 5B illustrate schematic views of memory arrays including multiple ReRAM cells, in accordance with some embodiments.

A brief description of memory arrays will now be described with reference to FIGS. 5A and 5B to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 5A illustrates a memory array 500 including nine ReRAM cells 502, in accordance with some embodiments. In general, any number of ReRAM cells may be arranged into one array. Connections to each ReRAM cell 502 are provided by signal lines 504 and 506, which may be arranged orthogonally to each other. ReRAM cells 502 are positioned at crossings of signal lines 504 and 506 that typically define boundaries of each ReRAM cell in array 500.

Signal lines 504 and 506 are sometimes referred to as word lines and bit lines. These lines are used to read and write data into each ReRAM cell 502 of array 500 by individually connecting ReRAM cells to read and write controllers. Individual ReRAM cells 502 or groups of ReRAM cells 502 can be addressed by using appropriate sets of signal lines 504 and 506. Each ReRAM cell 502 typically includes multiple layers, such as first and second electrodes, resistive switching layer, embedded resistors, embedded current steering elements, and the like, some of which are further described elsewhere in this document. In some embodiments, a ReRAM cell includes multiple resistive switching layers provided in between a crossing pair of signal lines 504 and 506.

As stated above, various read and write controllers may be used to control operations of ReRAM cells 502. A suitable controller is connected to ReRAM cells 502 by signal lines 504 and 506 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 500 or each ReRAM cell 502. For example, to avoid the parasitic-path-problem, i.e., signal bypasses by ReRAM cells in their low resistance state (LRS), serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 5B:
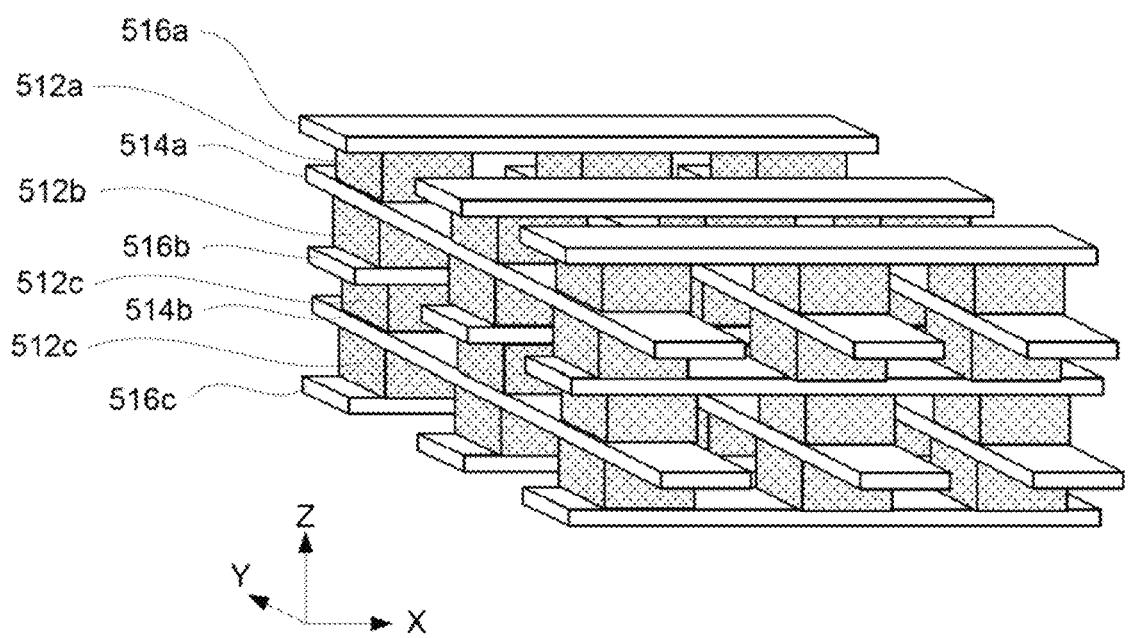

In some embodiments, a memory device may include multiple array layers as, for example, illustrated in FIG. 5B. In this example, five sets of signal lines 514a-b and 516a-c are shared by four ReRAM arrays 512a-c. As with the previous example, each ReRAM array is supported by two sets of signal lines, e.g., array 512a is supported by 514a and 516a. However, middle signal lines 514a-b and 516b, each is shared by two sets ReRAM arrays. For example, signal line set 514a provides connections to arrays 512a and 512b. First and second sets of signal lines 516a and 516c are only used for making electrical connections to one array. This 3-D arrangement of the memory device should be distinguished from various 3-D arrangements in each individual ReRAM cell.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A resistive switching nonvolatile memory element comprising:
   a first layer formed on a substrate,
      wherein the first layer is a current steering element comprising one or more nitrides;
   a second layer formed over the first layer,
      wherein the second layer is a resistive switching layer;
   a third layer formed over the second layer,
      wherein the third layer is a resistive layer having a substantially constant resistance, and
      wherein the third layer comprises a semi-metallic material,
         wherein the semi-metallic material is, at least in part, amorphous,
         wherein the semi-metallic material is more than 0% and less than 5% crystalline by volume; and
   a fourth layer formed over the third layer, wherein the fourth layer is a top electrode;
   wherein the second layer directly interfaces the first layer and the third layer; and
   wherein the third layer directly interfaces the second layer and the fourth layer.

2. The resistive switching nonvolatile memory element of claim 1, wherein the third layer comprises one of hafnium oxide, zirconium oxide, tantalum oxide, titanium oxide, hafnium oxynitride, zirconium oxynitride, tantalum oxynitride, or titanium oxynitride.

3. The resistive switching nonvolatile memory element of claim 1, wherein the third layer comprises hafnium oxide, and
   wherein an atomic ratio of oxygen to hafnium in the hafnium oxide is based on:
      a designated resistance of the nonvolatile memory element,
      a designated diffusion characteristic of the third layer, and
      a designated amount of oxygen vacancies present in the third layer.

4. The resistive switching nonvolatile memory element of claim 1, wherein the third layer comprises hafnium oxide having a ratio of oxygen to hafnium of about 1.5.

5. The resistive switching nonvolatile memory element of claim 1, wherein the third layer comprises a material that is a nitride, and
   wherein the nitride includes an amount of nitrogen sufficient to make the material charge neutral.

6. The resistive switching nonvolatile memory element of claim 1, wherein the third layer comprises oxygen vacancies.

7. The resistive switching nonvolatile memory element of claim 1, wherein the third layer comprises hafnium oxide having a ratio of oxygen to hafnium that is between about 1.0 and 1.8.

8. The resistive switching nonvolatile memory element of claim 1, wherein the third layer has a thickness between about 5 nm and 10 nm.

9. The resistive switching nonvolatile memory element of claim 1 wherein, the third layer has a thickness between about 3 nm and 8 nm.

10. The resistive switching nonvolatile memory element of claim 1, wherein the third layer is configured to remain at least partially amorphous when subjected to anneal at a temperature of 750 degrees Celsius.

11. The resistive switching nonvolatile memory element of claim 1, wherein the second layer comprises, at least in part, amorphous silicon oxide.

12. The resistive switching nonvolatile memory element of claim 1, wherein the first layer comprises titanium nitride, and wherein the fourth layer comprises tantalum nitride.

13. A resistive switching nonvolatile memory element comprising:
   a substrate;
   a first layer formed on the substrate,
      wherein the first layer is a current steering element comprising one or more nitrides;
   a second layer formed over the first layer,
      wherein the second layer is a resistive switching layer;
   a third layer formed over the second layer,
      wherein the third layer is a resistive layer having a substantially constant resistance,
      wherein the third layer comprises a semi-metallic material,
         wherein the semi-metallic material is, at least in part, amorphous,
         wherein the semi-metallic material is more than 0% and less than 5% crystalline by volume, and
      wherein the third layer comprises hafnium oxide,
         wherein an atomic ratio of oxygen to hafnium in the hafnium oxide is based on:
            a designated resistance of the nonvolatile memory element, a designated diffusion characteristic of the third layer, and a designated amount of oxygen vacancies present in the third layer; and a fourth layer formed over the third layer, wherein the fourth layer is a top electrode.

14. The resistive switching nonvolatile memory element of claim 13, wherein the third layer has a thickness between about 5 nm and 10 nm.

15. The resistive switching nonvolatile memory element of claim 13, wherein the first layer comprises titanium nitride, and wherein the fourth layer comprises tantalum nitride.

16. The resistive switching nonvolatile memory element of claim 13, wherein the second layer comprises, at least in part, amorphous silicon oxide.

17. The resistive switching nonvolatile memory element of claim 13, wherein the third layer comprises hafnium oxide having a ratio of oxygen to hafnium that is between about 1.0 and 1.8.

18. The resistive switching nonvolatile memory element of claim 13, wherein the third layer comprises hafnium oxide having a ratio of oxygen to hafnium that is about 1.5.

19. The resistive switching nonvolatile memory element of claim 13, wherein the third layer has a thickness between about 3 nm and 8 nm.

* * * * *